United States Patent
Sironi et al.

(10) Patent No.: US 11,212,937 B2
(45) Date of Patent: Dec. 28, 2021

(54) METHOD AND SYSTEM FOR PREVENTING OR CORRECTING FAN REVERSE ROTATION DURING ONLINE INSTALLATION AND REMOVAL

(71) Applicant: CISCO TECHNOLOGY, INC., San Jose, CA (US)

(72) Inventors: Paolo Sironi, Gallarate (IT); Emanuele Umberto Giacometti, Turin (IT); Rohit Dev Gupta, Bangalore (IN); Joel Richard Goergen, Soulsbyville, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 25 days.

(21) Appl. No.: 16/360,956

(22) Filed: Mar. 21, 2019

(65) Prior Publication Data

US 2020/0305306 A1   Sep. 24, 2020

(51) Int. Cl.
  *G05B 19/05*  (2006.01)
  *H05K 7/20*  (2006.01)

(52) U.S. Cl.
  CPC ......... *H05K 7/20209* (2013.01); *G05B 19/05* (2013.01); *H05K 7/20172* (2013.01); *G05B 2219/14005* (2013.01)

(58) Field of Classification Search
  CPC .......... H05K 7/20209; H05K 7/20172; G05B 19/05; G05B 2219/14005
  USPC ....................................................... 700/300
  See application file for complete search history.

(56) References Cited

U.S. PATENT DOCUMENTS

| 6,008,995 | A | 12/1999 | Pusateri |
| 6,373,207 | B1 * | 4/2002 | Yablonovitch ............ H02P 3/12 318/362 |
| 6,767,186 | B2 | 7/2004 | Olesiewicz |
| 6,801,004 | B2 | 10/2004 | Frankel |
| 6,826,456 | B1 | 11/2004 | Irving |
| 6,855,881 | B2 | 2/2005 | Khoshnood |
| 6,954,684 | B2 | 10/2005 | Frankel |
| 6,966,786 | B1 | 11/2005 | Motojima |
| 7,108,559 | B2 | 9/2006 | Shtargot |
| 7,184,268 | B2 | 2/2007 | Espinoza-Ibarra |
| 7,224,588 | B2 | 5/2007 | Nieman |
| 7,277,296 | B2 | 10/2007 | Ice |
| 7,425,117 | B2 | 9/2008 | Robinson |
| 7,621,460 | B2 | 11/2009 | Dorr |
| 8,276,397 | B1 | 10/2012 | Carlson |
| 8,368,329 | B1 | 2/2013 | Depew |
| 8,700,923 | B2 | 4/2014 | Fung |
| 8,842,430 | B2 | 9/2014 | Hellriegel |
| 9,203,188 | B1 | 12/2015 | Siechen |

(Continued)

FOREIGN PATENT DOCUMENTS

JP   2017059141 A  *  3/2017  ............. F04D 27/00

*Primary Examiner* — Kenneth M Lo
*Assistant Examiner* — Michael W Choi

(57) ABSTRACT

In one embodiment, a method includes detecting reverse rotation of a fan inserted into a modular electronic system comprising at least one other fan, wherein the reverse rotation of the fan is caused by a back pressure generated by the other fan rotating in a forward direction, applying current pulses to stop reverse rotation of the inserted fan and start rotation of the fan in a forward direction, and operating all of the fans with rotation in the forward direction.

17 Claims, 11 Drawing Sheets

(56) References Cited

U.S. PATENT DOCUMENTS

| | | |
|---|---|---|
| 9,273,906 B2 | 3/2016 | Goth |
| 9,456,517 B2 | 9/2016 | Laufer |
| 9,510,479 B2 | 11/2016 | Vos |
| 9,523,432 B2 | 12/2016 | Anderl |
| 9,585,283 B2 | 2/2017 | Chia |
| 9,693,244 B2 | 6/2017 | Maruhashi |
| 9,723,745 B2 | 8/2017 | Qi |
| 9,938,990 B2 | 4/2018 | Amin-Shahidi |
| 2005/0174737 A1* | 8/2005 | Meir ............ G06F 1/206 361/697 |
| 2006/0076912 A1* | 4/2006 | Yang ............ H02P 1/18 318/400.12 |
| 2006/0091837 A1* | 5/2006 | Xiong ........... H02P 1/18 318/400.12 |
| 2007/0081888 A1* | 4/2007 | Harrison ........ F04D 29/666 415/47 |
| 2010/0073872 A1* | 3/2010 | Pakravan ....... H05K 7/20572 361/695 |
| 2010/0114379 A1* | 5/2010 | Sato ............. F24F 1/38 700/275 |
| 2012/0064745 A1 | 3/2012 | Ottliczky |
| 2012/0201089 A1 | 8/2012 | Barth |
| 2013/0077923 A1 | 3/2013 | Peeters Weem |
| 2014/0337496 A1* | 11/2014 | Ramachandran .... H04L 41/24 709/223 |
| 2015/0042251 A1* | 2/2015 | Suzuki .......... H02P 6/20 318/400.11 |
| 2015/0152876 A1* | 6/2015 | Chen ............ F04D 27/001 417/15 |
| 2016/0262288 A1 | 9/2016 | Chainer |
| 2018/0088610 A1* | 3/2018 | Lee ............. G05D 23/1917 |
| 2019/0235597 A1* | 8/2019 | Chen ........... G06F 11/0751 |

* cited by examiner

METHOD AND SYSTEM FOR PREVENTING OR CORRECTING FAN REVERSE ROTATION DURING ONLINE INSTALLATION AND REMOVAL

TECHNICAL FIELD

The present disclosure relates generally to network communications devices, and more particularly, to cooling fan control in modular electronic systems during online insertion and removal of fans.

BACKGROUND

Network communications systems utilize network devices that include complex and sensitive electronic components that require cooling, which is often provided by fans. It is desirable to replace a fan without powering down the system or impacting the performance of other modules in the system, such as by disrupting system cooling. During fan OIR (Online Installation and Removal), an installed fan may start rotating in a reverse direction due to negative pressure created by the remaining operating fans.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1:
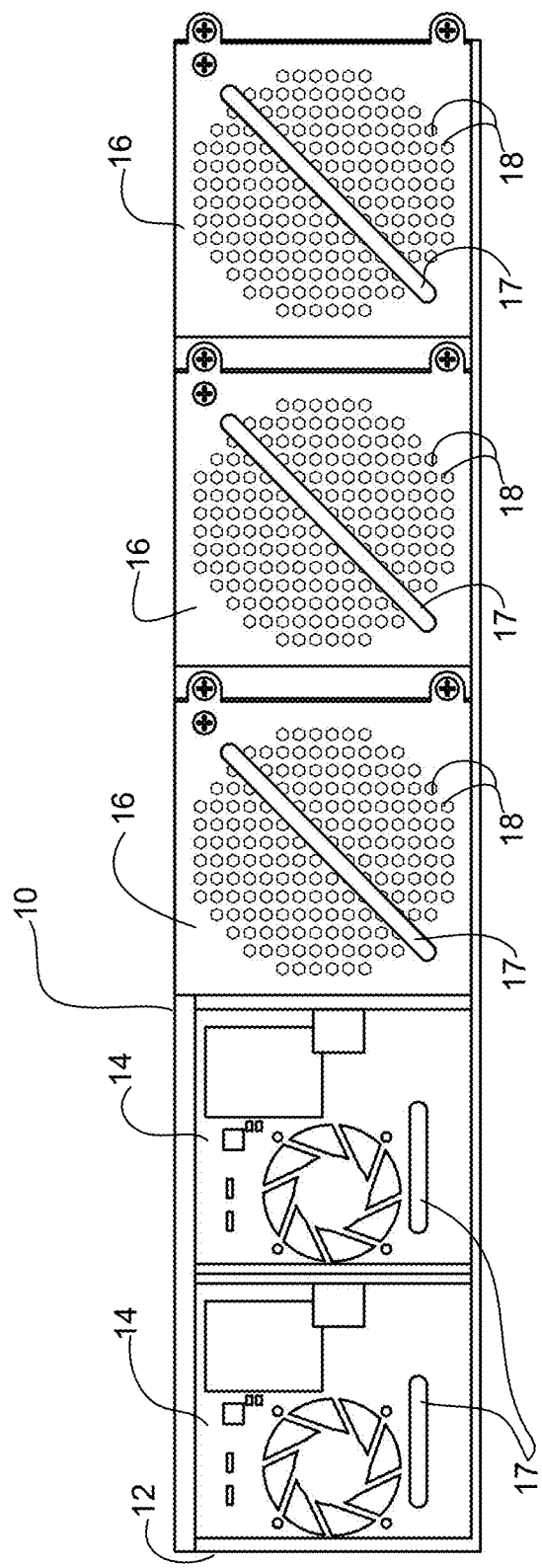
FIG. 1 is a rear view of one example of a modular electronic system with removable fans.

In one embodiment, a method generally comprises detecting insertion of a fan into a modular electronic system comprising at least one other fan rotating in a forward direction to cool components of the modular electronic system, reducing a fan speed of the other fan to reduce back pressure generated by the other fan and prevent reverse rotation of the inserted fan, and controlling fan speed according to system temperature with all of the fans rotating in the forwarding direction.

In one or more embodiments, reducing the fan speed of the other fan comprises reducing the fan speed for a specified period of time.

In one or more embodiments, reducing the fan speed of the other fan comprises reducing the fan speed until rotation of the inserted fan in the forward direction is detected.

In one or more embodiments, reducing the fan speed comprises running an algorithm implemented in programmable logic.

In one or more embodiments, the method further comprises blocking a fan alarm upon reducing the fan speed of the other fan.

In one or more embodiments, the method further comprises removing a fan from the modular electronic system and increasing the fan speed of the other fan until detecting insertion of the fan.

In one or more embodiments, detecting insertion of the fan into the modular electronic system comprises receiving communication from the inserted fan indicating reverse rotation.

In another embodiment, a method generally comprises detecting reverse rotation of a fan inserted into a modular electronic system comprising at least one other fan, wherein the reverse rotation of the fan is caused by a back pressure generated by the other fan rotating in a forward direction, applying current pulses to stop reverse rotation of the inserted fan and start rotation of the fan in a forward direction, and operating all of the fans with rotation in the forward direction.

In yet another embodiment, a modular electronic system generally comprises an electronic module, at least two removable fans for cooling the electronic module, and a fan controller for controlling the speed of the fans and receiving input comprising the speed and direction of rotation of the fans. The fan controller is operable upon detecting reverse rotation of one of the fans to initiate application of current pulses to the fan to stop reverse rotation of the fan.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Network devices such as switches, routers, server racks, or other electronic devices may be configured as a modular electronic system with a plurality of removable modules (e.g., service cards, line cards, fabric cards, power supply units (PSUs), fans (fan trays), filters, or other cards, components, or modules). In a modular configuration system, Online Insertion and Removal (OIR) describes a process of replacing a module for repair or replacement (e.g., product upgrade, failed module replacement) while the network device is operational, without disrupting performance of the modular system. During this process, the system continues to be functional and a faulty module is replaced with a new, repaired, or upgraded module.

In an air-cooled modular electronic system, cooling air is supplied to each of the modules to maintain a normal cool state of each module. Depending on the complexity of the system design, the OIR process may take some time (e.g., about five minutes). When a fan is removed, one or more remaining fans continue to operate to cool electronic modules within the system. After the fan is removed, ambient air may rush into the open slot, resulting in reverse airflow through the slot. When a new fan is installed, the fan may start to rotate in a reverse direction due to negative pressure (back pressure) created by the remaining operating fans in the system. During fan removal and installation, the speed of the remaining fans is typically increased to provide sufficient cooling. At these high speeds, where the back pressure is high, recovery from reverse rotation is difficult or impossible. Thus, a newly installed working fan may not operate properly when inserted during OIR due to the back pressure induced by the other fans and may be incorrectly identified as a faulty fan.

The embodiments described herein allow a fan to rotate in the correct (forward) direction after insertion into an operating modular electronic system even if the fan starts up rotating in a reverse direction, thereby improving system reliability. As described in detail below, a first embodiment involves lowering the speed of remaining fans when a new fan is installed. The remaining fans operate at a lower speed to reduce the back pressure, thereby enabling the new fan to start operation with rotation in a forward direction. A second embodiment detects reverse rotation of the fan and applies a current pulse to correct the fan rotation. This allows for proper fan operation independent from the operating conditions of the other installed fans and does not impact system cooling since the other fans may continue to operate at a high speed.

Figure 2:
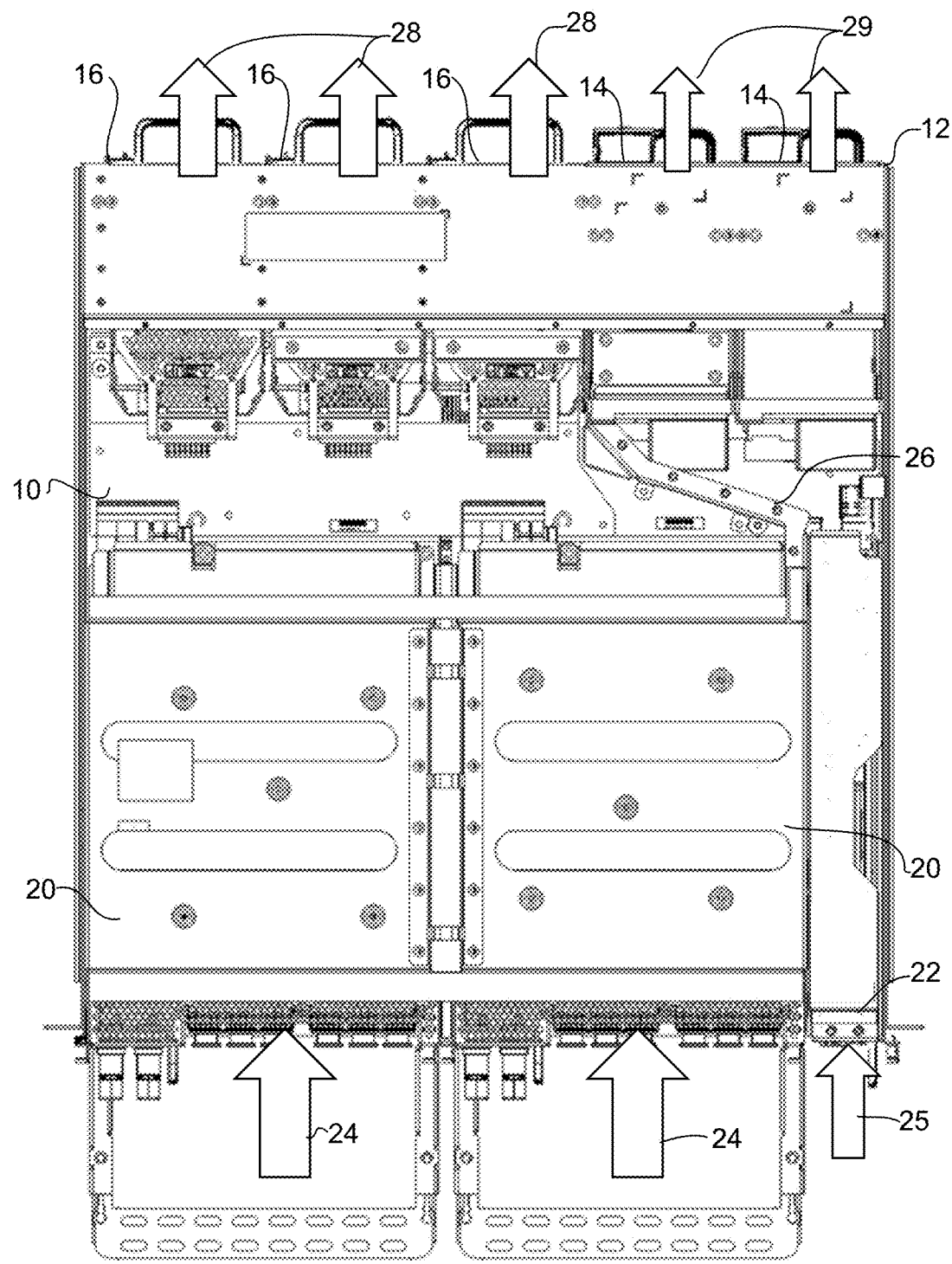
FIG. 2 is a top view of the modular electronic system of FIG. 1 with arrows indicating a direction of airflow through the system during normal operation of the fans.

Referring now to the drawings, and first to FIGS. 1 and 2, an example of a network device (modular electronic system) 10 that may implement the embodiments described herein is shown. The modular electronic system 10 may operate, for example, as a switch, router, server, or any other network device comprising modules (components, cards, trays, elements) included in modular sections. In one or more embodiments, the modular electronic system operates in a data communications network including multiple network devices that may communicate over one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet, intranet, radio access network, public switched network, or any other network).

The modular electronic system 10 shown in FIGS. 1 and 2 comprises a plurality of modules including PSUs (Power Supply Units) 14, fan trays (fans) 16, line cards 20, and a controller card 22 contained within a frame (chassis) 12. The system 10 may include one or more frames or structures 12 configured to support various components and slidably receive any number of removable modules. It is to be understood that the type, number, and arrangement of components and modules shown and described herein is only an example and the modular electronic system 10 may include any number or type of modules arranged in any format, without departing from the scope of the embodiments.

FIG. 1 is a rear view of the modular electronic system 10 comprising two power components 14 and three fan trays 16. Each fan tray may comprise one or more fans. In one example, each module 14, 16 may comprise a handle 17 for ease of removal of the module. Airflow openings 18 are shown on a panel of the fan tray 16. As described below with respect to FIG. 2, the fans pull air through the modular electronic system 10.

Referring now to FIG. 2, a top view of the modular electronic system 10 is shown with a top cover removed. The frame 12 comprises a plurality of rear slots for receiving the fans 16 and power components 14, as previously described. A front portion of the frame 12 includes openings for receiving the line cards 20, controller card 22, or other electronic modules such as fabric cards, service cards, or combo cards. As indicated by arrows 24, air enters through a system air inlet at the line cards 20. Air (PSU airflow) enters at a controller air inlet as indicated by arrow 25. In the example shown in FIG. 2, a wall 26 partitions PSU airflow from fan airflow. The fan airflow exits through system exhaust at the fans 16, as indicated by arrows 28, and the airflow through the PSUs 14 exits at a controller exhaust, as indicated at arrows 29.

Figure 3A:
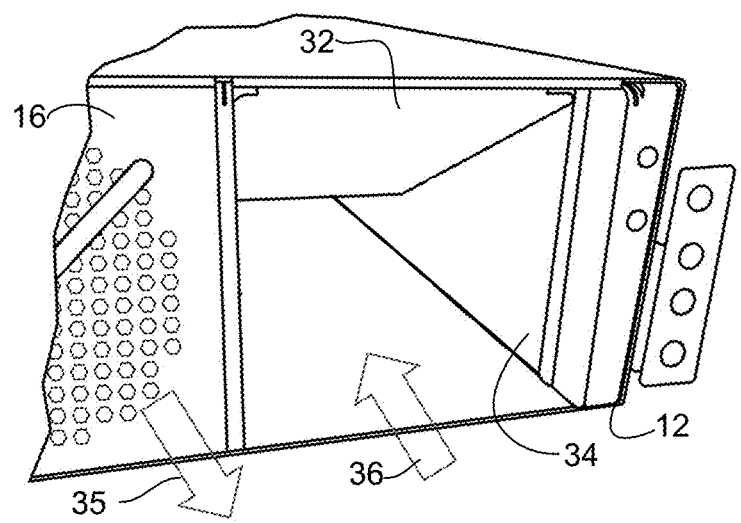
FIG. 3A is a partial rear perspective of the modular electronic system of FIG. 1 indicating airflow direction with a fan removed during OIR.

FIG. 3A is a perspective rear view of a portion of the modular electronic system 10, illustrating a fan door 32 partially open allowing airflow into fan tray slot 34. Adjacent fan tray 16 is installed and as previously described, is still operational during the OIR process. When the fan 16 is inserted into the opening 34, the fan engages with the hinged door 32, which is easily rotated up against an upper panel and out of the way of the fan tray. In normal operation, the fans 16 within the remaining fan tray slots are all moving air outward (as indicated at arrow 35) at high velocity. During OIR, the fan speed is often increased (e.g., from nominal 50% to 100%) to prevent the loss of cooling to the active modules. Due to the air suction (back pressure) from adjacent fans spinning at a high speed, airflow enters at the opening 34 as shown at arrow 36. During fan OIR, there is reverse airflow due to high back pressure within the system.

Figure 3B:
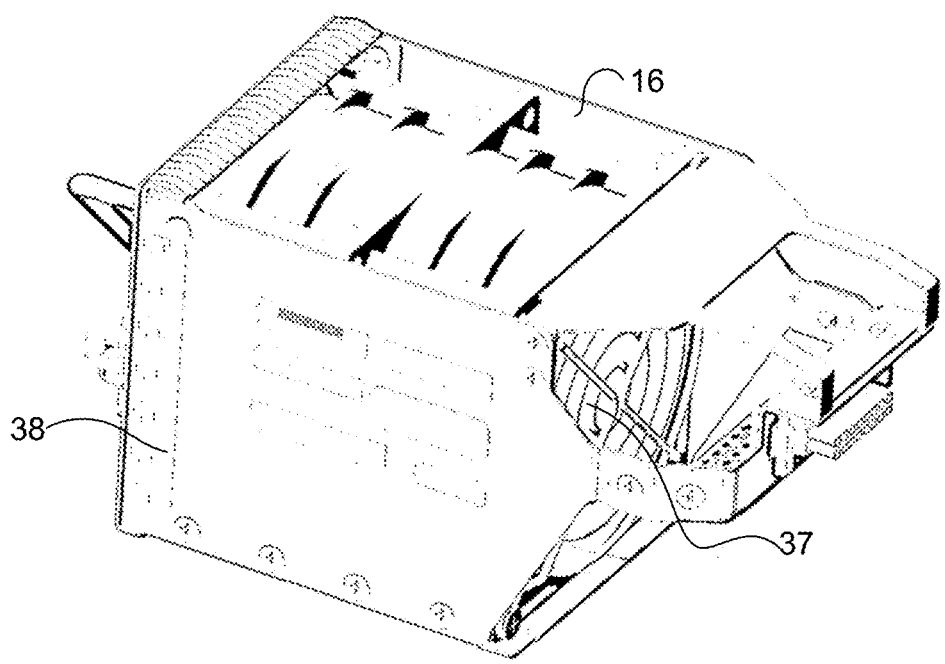
FIG. 3B is a perspective illustrating an example of the fan removed from a fan slot in FIG. 3A.

FIG. 3B illustrates an example of the fan 16 removed from fan tray slot 34 in FIG. 3A. The fan 16 may comprise, for example, a dual rotor high performance fan 37 contained within a frame 38. The fan (fan tray) 16 may also include one or more sensors (e.g., for monitoring temperature, speed, or rotation direction), controller (e.g., microcontroller), firmware, and electrical interfaces (power, signal interfaces). It is to be understood that this is only an example and the embodiments described herein may be implemented to prevent or correct reverse fan rotation in different types of fans.

Figure 4A:
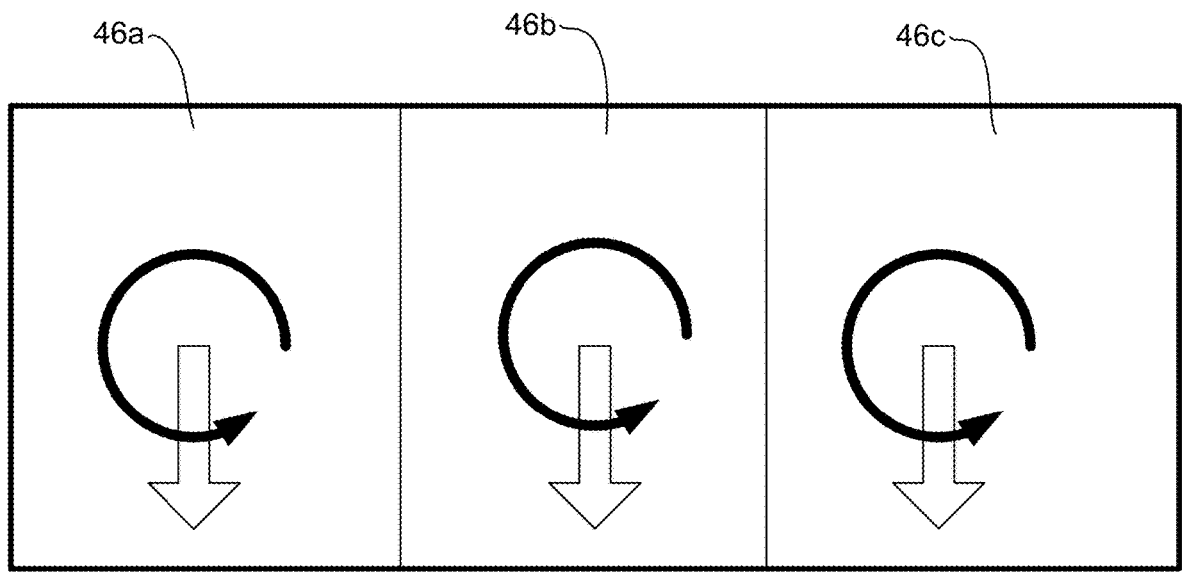
FIG. 4A is a schematic illustrating rotation direction of the fans shown in FIG. 1 and airflow direction with all fans rotating in a forward direction (counterclockwise arrow in FIG. 4A).
Figure 4B:
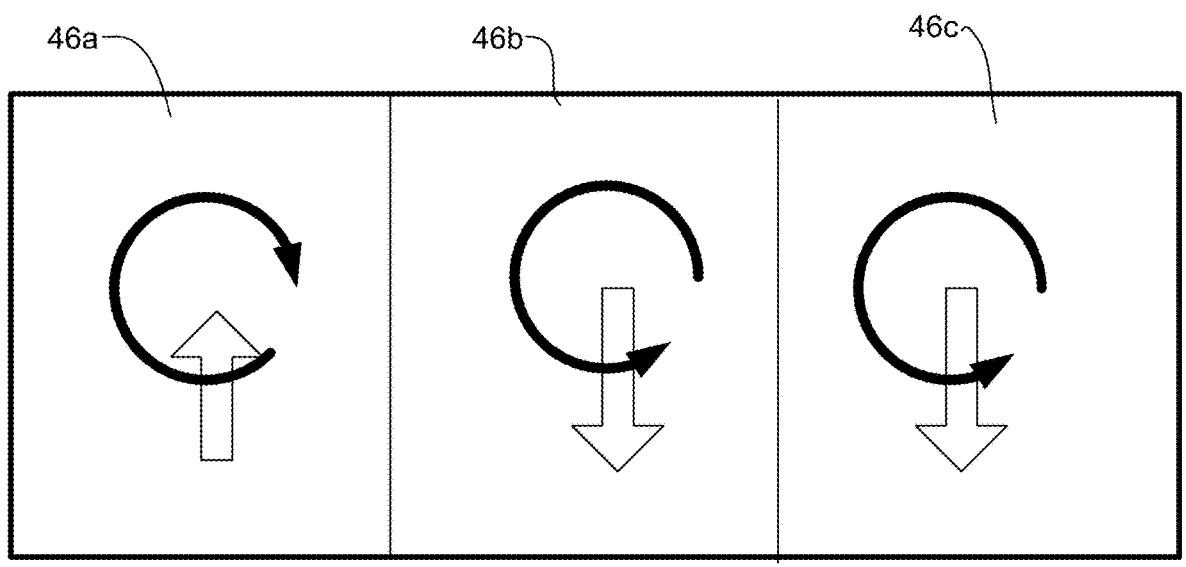
FIG. 4B illustrates two of the fans of FIG. 4A rotating in the forward direction and a third fan rotating in a reverse direction (clockwise arrow in FIG. 4B).

FIGS. 4A and 4B are schematic rear views illustrating rotation of fans 46a, 46b, and 46c and corresponding airflow through the fan. In FIG. 4A, all three fans are spinning in a forward direction and pulling airflow through the system and out from a rear of the modular electronic system as shown in the top view of FIG. 2. FIG. 4B illustrates an example in which one of the fans 46a is operating in a reverse direction after installation due to back pressure created by the remaining fans 46b, 46c rotating in the forward direction. The airflow at fan 46A in FIG. 4B is being pulled into the modular electronic system.

It is to be understood that the terms forward and reverse as used herein to describe fan rotation are relative terms based on a normal rotating direction of the fan. In the example shown in FIGS. 4A and 4B, a counterclockwise rotation arrow is referred to as forward (normal) operating direction and a clockwise rotation arrow (fan 46a in FIG. 4B) is considered a reverse (incorrect) rotation direction. In one or more embodiments, normal rotation may be clockwise when viewed from exhaust side of the fan. Different fans may have different operating directions of rotation based on a location of the fan and airflow path through the modular electronic system. Thus, the term forward as used herein refers to a normal operating direction of rotation of the fan and the term reverse as used herein refers to an opposite rotational direction, which the embodiments described herein are designed to overcome (correct) so that the fan rotates in its forward (normal) operating direction.

In the first embodiment, in order to prevent reverse rotation of the fan, the speed of operating fans is lowered when a fan is replaced (new or repaired fan installed). A fan controller (e.g., control logic) may receive input from one or more sensors to identify when the fan is inserted. In one example, a module sensor (e.g., optical sensor, switch) (not shown) may be located within the fan opening 34 (FIG. 3) to indicate insertion of the fan 16. The sensor may detect, for example, removal of a fan and insertion of a fan into the open slot, and provide electrical input to the fan controller. As described below, the controller may use this information to begin the process of reducing the speed of the remaining fans (or fan). The fan 16 may also include sensors for detecting fan speed (e.g., rpm (revolutions per minute), rotation direction (+rpm, −rpm)) and system temperature, and providing this information to the fan controller (e.g., electrical signal corresponding to fan rpm, rotation direction, ambient temperature). In one or more embodiments, an algorithm may be implemented inside programmable logic (e.g., FPGA (Field-Programmable Gate Array)) rather than relying on software in order to cover headless mode (i.e., without a graphical user interface) and any potential software stuck condition. All speed (rpm) values and time settings inside the FPGA may be fully programmable or overwritten by software, for example.

Figure 5:
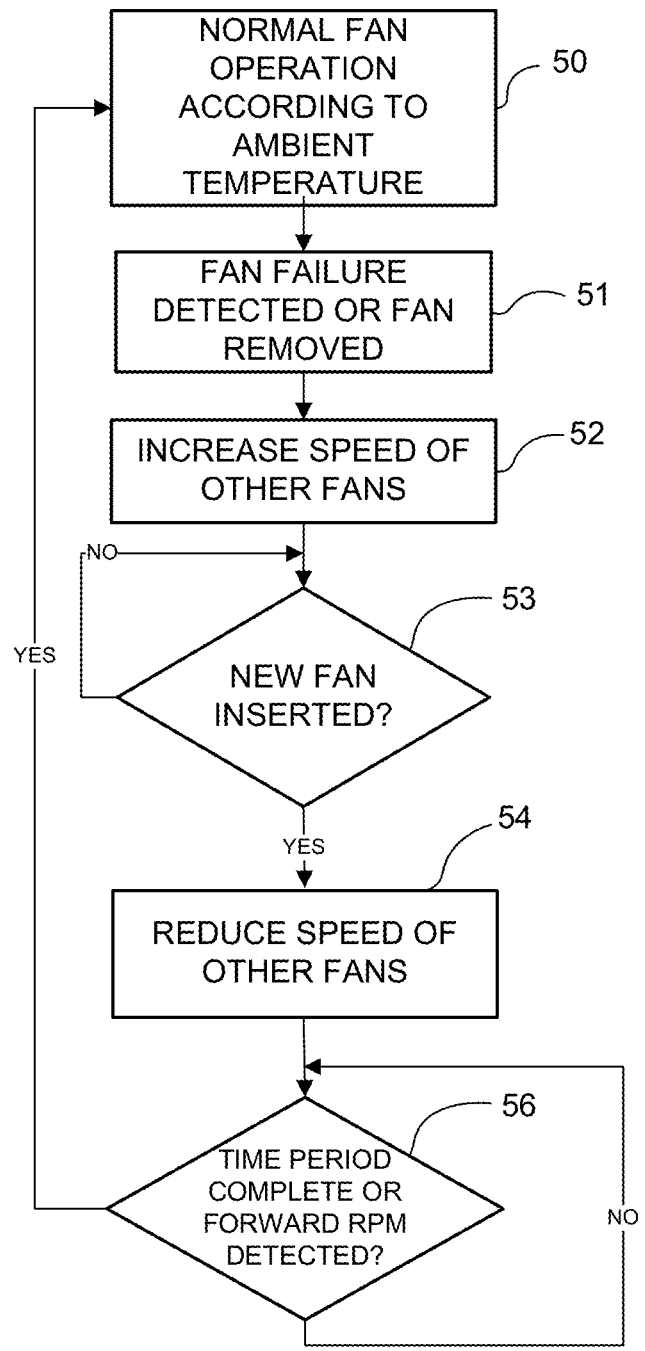
FIG. 5 is a flowchart illustrating a process for preventing reverse fan rotation during fan OIR, in accordance with a first embodiment.

FIG. 5 is a flowchart illustrating an overview of a process for cooling fan control in a modular electronic system during fan OIR to prevent reverse fan rotation, in accordance with the first embodiment. At step 50, fans are operating in normal condition (e.g., according to ambient temperature as measured by system sensors). A fan failure is detected or a fan is removed (step 51). The speed of the remaining fans (at least one other fan rotating in a forward direction to cool components of the modular electronic system) may be increased (e.g., to maximum speed or any percentage of maximum operating speed) to provide system cooling while the fan is removed. If the failed fan begins to operate normally, all fans will return to normal operation. However, if the fan failure continues, the faulty fan may be removed and a new fan inserted (step 53). Upon detecting insertion of a fan into the modular electronic system (e.g., sensor detects insertion of fan into open slot or sensor detects reverse rotation of inserted fan) (step 53) the fan controller reduces the speed of the remaining fans (or fan) to reduce back pressure generated by the remaining fans to a level that allows the inserted fan to rotate in a forward direction (step 54). This may involve, for example, stopping one or more fans, reducing the speed of one or more fans, or a combination thereof, for a specified period of time or until rotation of the inserted fan in a forward direction is detected (steps 54 and 56). For example, the process may be open loop with all fans returning to normal operation after a specified period of time (e.g., fifteen seconds or any other suitable time period) or the process may use closed loop operation with fans returning to normal operation after forward rotation of the new fan is detected or a specified forward speed is reached by the new fan. After a specified time period or detection of normal operation (e.g., speed of new fan≥minimum rpm, rotation in forward direction), the fan controller may run all of the fans in accordance with normal operation (e.g., increase speed of one or more fans and regulate all fans per working condition algorithm (e.g., speed determined based on temperature)) (step 50). Alarm generation may be blocked (masked) until working conditions are reached in order to prevent a false alarm from being raised at system level.

In one or more embodiments, the fan controller may comprise an FPGA programmed with a default lower rpm value to apply when the new fan is inserted and a time period to run the fans at the lower speed (steps 54 and 56). The programmed speed values and time periods may be modified by software.

It is to be understood that the process shown in FIG. 5 is only an example and steps may be modified, combined, removed, or added without departing from the scope of the embodiments.

In one or more embodiments, Bluetooth communications may be provided for communication between fans. For example, a Bluetooth device may be installed into each fan unit. Software may be used to program the process described above with respect to the flowchart of FIG. 5 at the startup for each of the fans. A microcontroller in each fan may communicate with the other fans to provide speed and input current. The software may be used to reprogram a new fan at OIR start. In one example, the new fan communicates reverse rpm to other fans and all other fans reduce speed until the new fan matches its speed to the remaining fans. All fans may then begin to increase their speed to desired rpm. Communications between fans may take place out of band. In this example, detection of insertion of the fan into the modular electronic system may comprise receiving communication from another fan indicating reverse rotation.

The second embodiment allows for correction of reverse fan rotation of an inserted fan independent from back pressure generated by the remaining fans in the modular electronic system. Thus, the remaining fan (or fans) may continue to operate at maximum speed (or any other speed) to maintain cooling in the system during fan OIR. As described below, fan microcontroller firmware may be used to detect reverse rotation of the fan, stop the fan rotation, and start the fan in the forward direction. The following first describes a low duty cycle current pulse that may be used for a startup procedure (e.g., for a rotor lock restart procedure) and why this process may not work for correcting reverse rotation of the fan.

Figure 6:
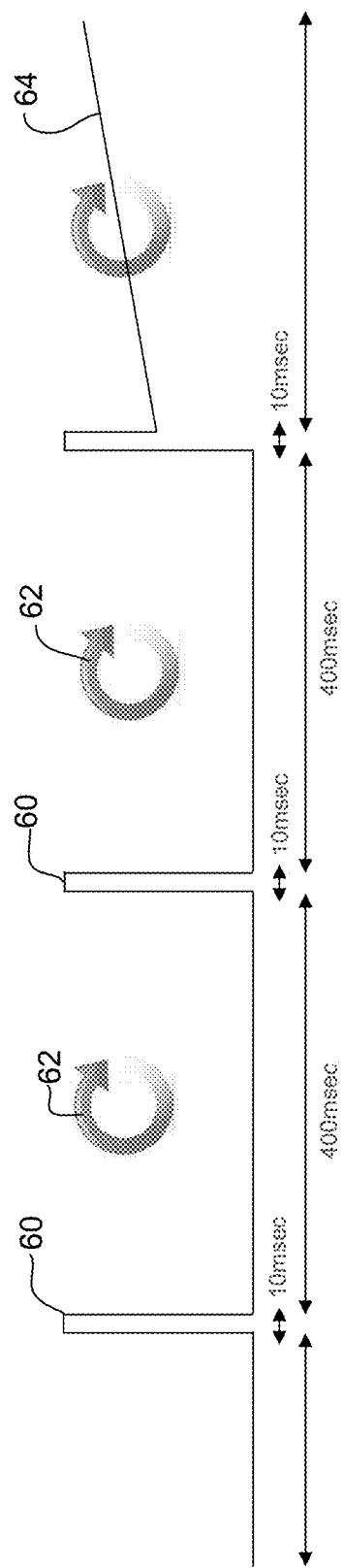
FIG. 6 illustrates a low duty cycle current pulse for use in a fan restart procedure, in accordance with one embodiment.

FIG. 6 illustrates an example of low duty cycle current pulses 60 that may be applied to start a fan or restart a fan with a locked (stuck) rotor. As shown in FIG. 6, the current may be pulsed at a low duty cycle (e.g., every 400 milliseconds (msec) for a period of 10 msec). When the rotor is locked, this low duty cycle current pulse 60 allows electronic devices inside the fan to survive for an unlimited period of time at maximum operating temperature of the fan. The clockwise arrows 62 in FIG. 6 indicate rotation of the fan in a forward (normal operating) direction. As shown in FIG. 6, when the rotor is free to rotate, after a few pulses, the fan reaches its operating defined speed with a constant current applied as indicated at 64.

Figure 7:
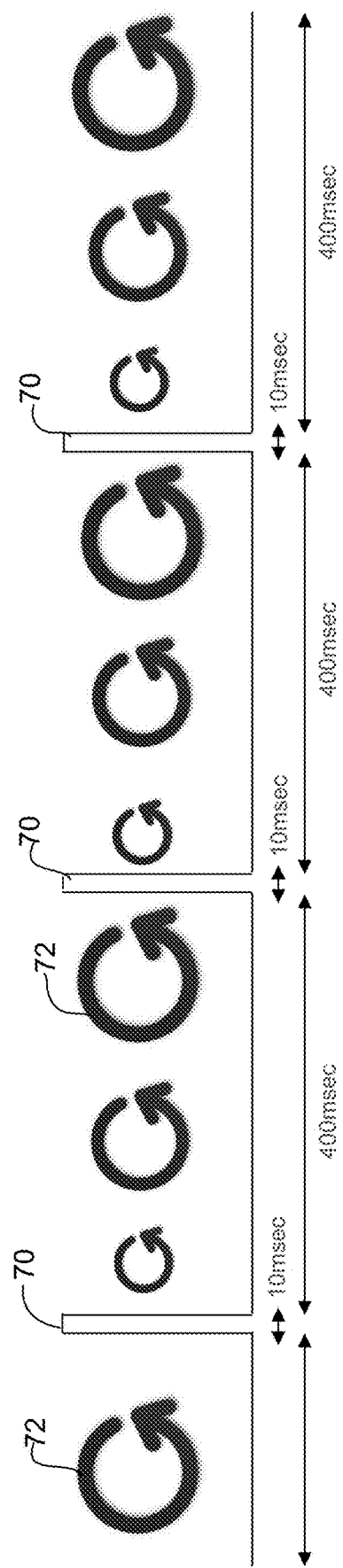
FIG. 7 illustrates a reverse rotating direction of a fan continuing to rotate in the reverse direction during the fan restart procedure shown in FIG. 6.

If the fan is spinning in reverse rotation due to back pressure created by the other fans, the low duty cycle current pulses may not be sufficient to stop the fan. Referring now to the example of FIG. 7, counterclockwise arrows 72 indicate rotation of the fan in a reverse direction with speed increasing between pulses. During the gap between two pulses 70, the fan reacquires its original reverse speed since the back pressure is still present due to forward rotation of the other fans. Increasing the duty cycle continuously (e.g., to a 10 msec pulse every 20 msec) is not a viable option because in the case of a locked rotor, this would damage or cause failure to electronic components (e.g., microcontroller, MOSFETs (Metal-Oxide-Semiconductor Field-Effect Transistors) inside the fan.

Figure 8:
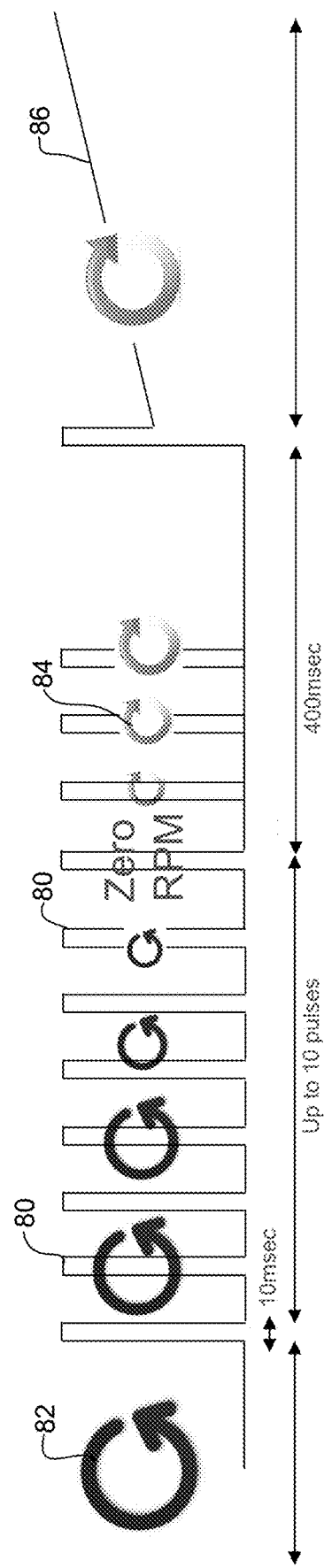
FIG. 8 illustrates an example of a high duty cycle current pulse for use in correcting reverse fan rotation, in accordance with a second embodiment.

FIG. 8 illustrates an example of high duty cycle current pulses 80 for use in correcting reverse fan rotation. As shown in FIG. 8, the inserted fan is rotating in the reverse direction (counterclockwise arrows 82) due to back pressure created by the operating fans during OIR of the fan. High duty cycle current pulses 80 are applied to stop the fan from rotating in the reverse direction. In one example, the current pulse 80 may be applied for 10 msec and repeated every 20-30 msec for a specified number of times. The high duty cycle current pulses 80 are applied at sufficiently close intervals to prevent the fan from stopping and reacquiring its reverse rotation between pulses (as described above with respect to FIG. 7). The number of pulses 80 applied is limited (e.g., ten or any other suitable number) so that the electronics within the fan are not overheated. As described below, the high duty cycle current pulses 80 may be repeated if forward rotation is not detected following a cool down period during which low duty cycle current pulses may be applied.

As soon as the fan is stopped (zero RPM in FIG. 8), the current pulses 80 may continue and the fan monitored for true forward rotation (clockwise arrow 84). Once forward rotation passes a specified level (e.g., 5000 rpm (approximately 33% maximum forward rpm level) or any other selected or programmed speed), normal startup procedure may resume with linear current control as indicated at 86. As noted above, if the fan does not reach the rated forward speed in a defined number of pulses, the normal startup procedure (FIGS. 6 and 7) may be performed to cool down the electronic devices in the fan. This allows functionality of the fan to remain consistent with normal operating behavior and no hardware changes are needed to the fan or changes in stress of electronic devices on the fan.

It is to be understood that the terms low duty cycle and high duty cycle as used herein are relative terms (e.g., high duty cycle has more pulses than low duty cycle within same time period, high duty cycle pulses are closer together than low duty cycle pulses) and that the number and timing of pulses described herein are only examples. The low duty cycle is designed to be sufficiently low to prevent overheating of the electronic components. The high duty cycle is designed to be sufficiently high to overcome the back pressure created by operating fans to stop reverse rotation and start forward rotation of the fan.

Figure 9:
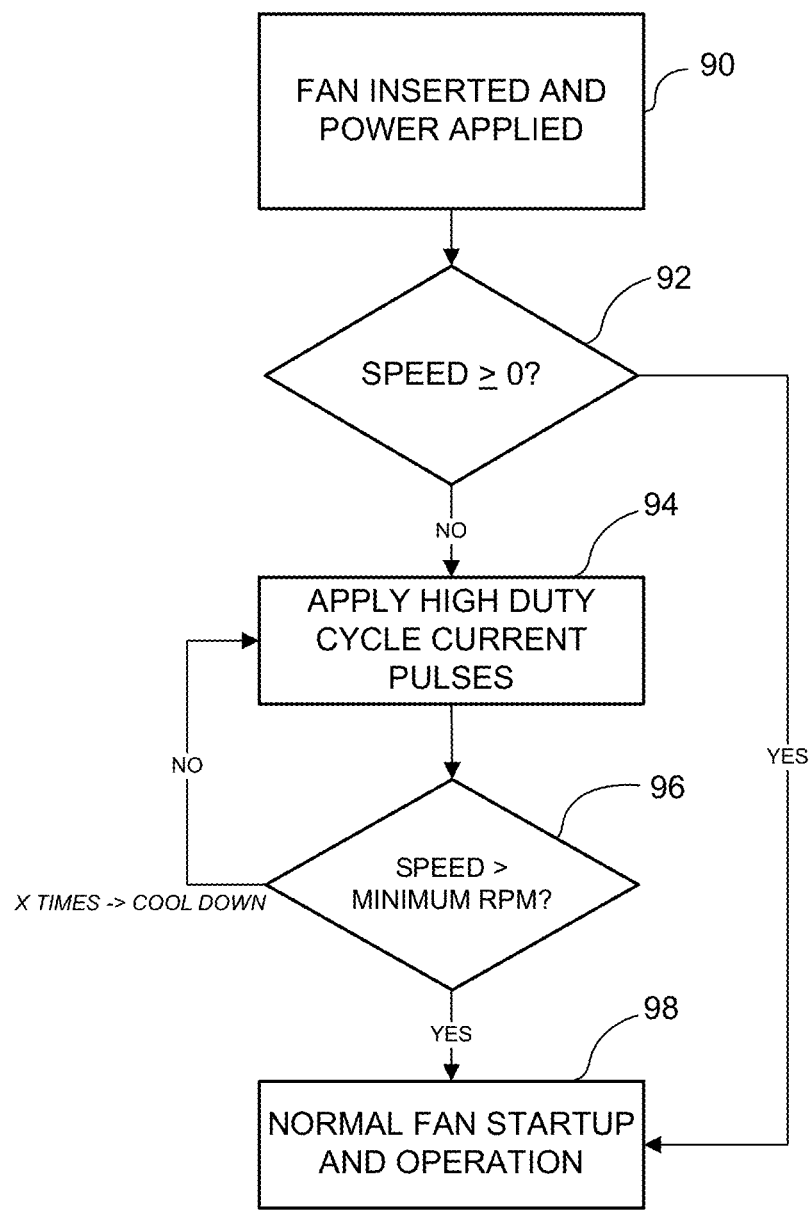
FIG. 9 is a flowchart illustrating an overview of a process for correcting reverse fan rotation in a newly installed fan, in accordance with the second embodiment.

FIG. 9 is a flowchart illustrating an overview of a process for correcting reverse rotation of a fan in a modular electronic system, in accordance with the second embodiment. The fan is inserted into the modular electronic system and power is applied at step 90. As previously described, a fan was removed during OIR with the remaining fan (or fans) continuing to operate to cool the modular electronic system (e.g., line cards or other electronic modules). The remaining fans (or fan) may be running at an increased speed to provide sufficient cooling during fan OIR. If the speed of the installed fan is equal to or greater than zero (fan rotating in forward direction), normal fan operation is performed (steps 92 and 98). If the fan speed is less than zero (fan rotation in reverse direction), high duty cycle current pulses are applied, as described above with respect to FIG. 8 (step 94). The high duty cycle current pulses comprise a set number of pulses and may be repeated one or more times if needed. As previously described, a cool down period may be applied between a set of high duty cycle current pulses. Thus, if the speed of reverse rotation is not reduced (closer to rpm=0) or a minimum forward rpm is not reached, a limited number of high duty cycle current pulses may be applied (x times) before performing a cool down process (e.g., apply low duty cycle current pulses). After forward rotation is detected (e.g., speed>minimum rpm (e.g., 0, 5000 rpm, or other rpm)) (step 96), the fan controller operates the fan according to normal fan operation (e.g., based on ambient temperature) (step 98). At this point, all fans may be controlled in accordance with normal operating conditions to cool components within the modular electronic system. If the speed of the remaining fans was increased during OIR, the speed of these fans may be reduced.

Figure 10:
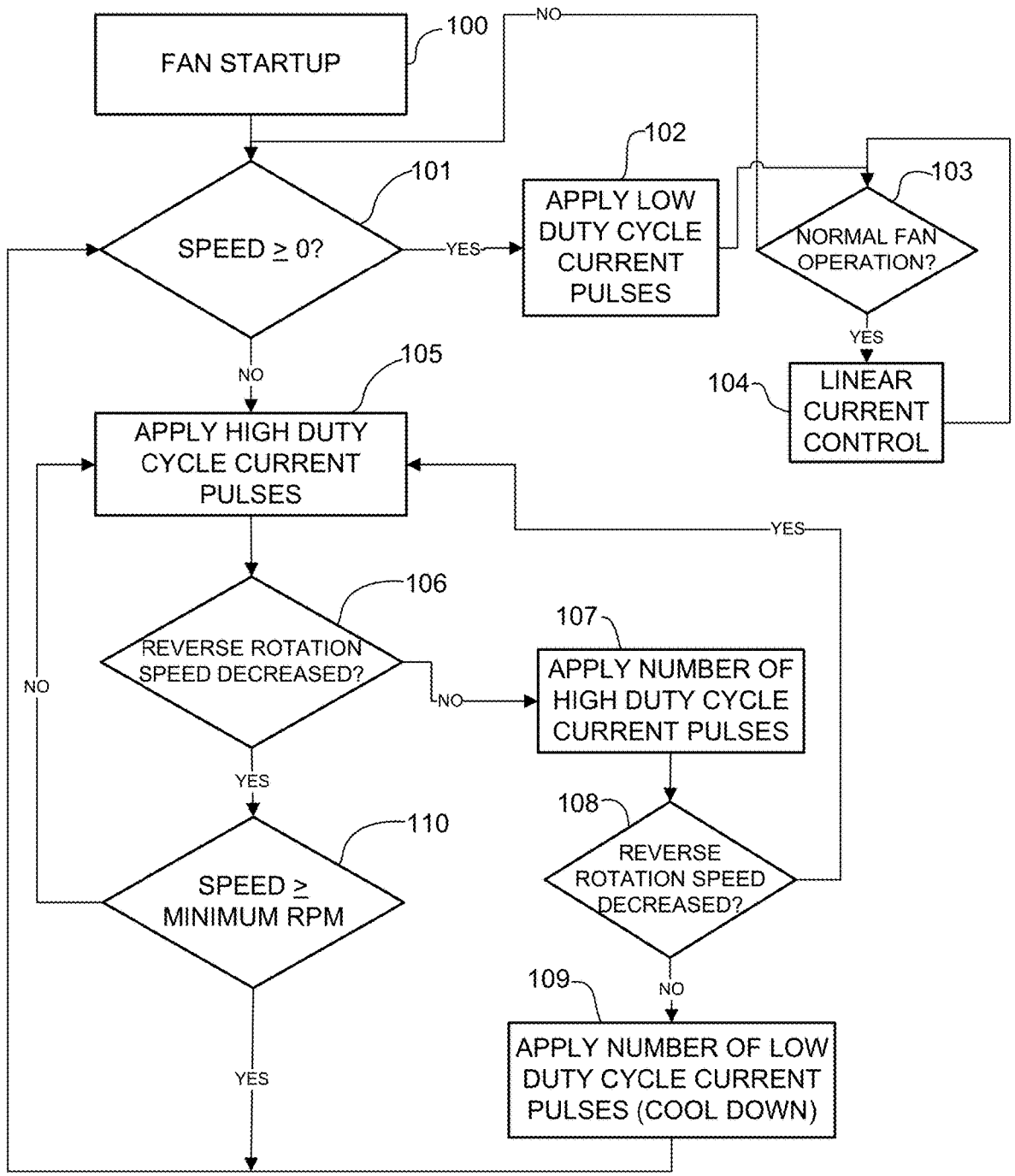
FIG. 10 is a flowchart illustrating details of the process shown in FIG. 9, in accordance with one embodiment.

FIG. 10 is a flowchart illustrating details of the process shown in FIG. 9, in accordance with one embodiment. A fan is inserted into the modular electronic system and power is applied at step 100 (fan startup). When the fan microcontroller boots up, fan rotor condition is detected. If the speed is equal to or greater than zero (step 101), a normal setup process begins. In this example, the startup process includes applying low duty cycle current pulses (step 102). If the fan operates at the proper speed (normal fan operation) (step 103) linear current control is applied (step 104). If the fan is not operating according to an input signal provided by the controller, the process returns to step 101. If the fan speed is less than zero (reverse rotation) the fan speed recovery process starts by applying high duty cycle current pulses (steps 101 and 105). If the fan continues rotating in the reverse direction and the speed has not decreased (step 106), ten high duty current pulses are applied (step 107). If the fan is still rotating in the reverse direction and the speed has not decreased (step 108), ten low duty cycle current pulses are applied to allow the electronics to cool down (step 109) and the process returns to step 101. If the speed decreases at step 106, the high duty pulses continue to be applied until the fan speed in the forward direction exceeds a minimum value (e.g., 5000 rpm) (step 110).

It is to be understood that the processes shown in FIGS. 9 and 10 and described above are only examples and that steps may be modified, added, combined, or removed, without departing from the scope of the embodiments. For example, a different number of pulses may be applied at steps 107 and 109.

Figure 11:
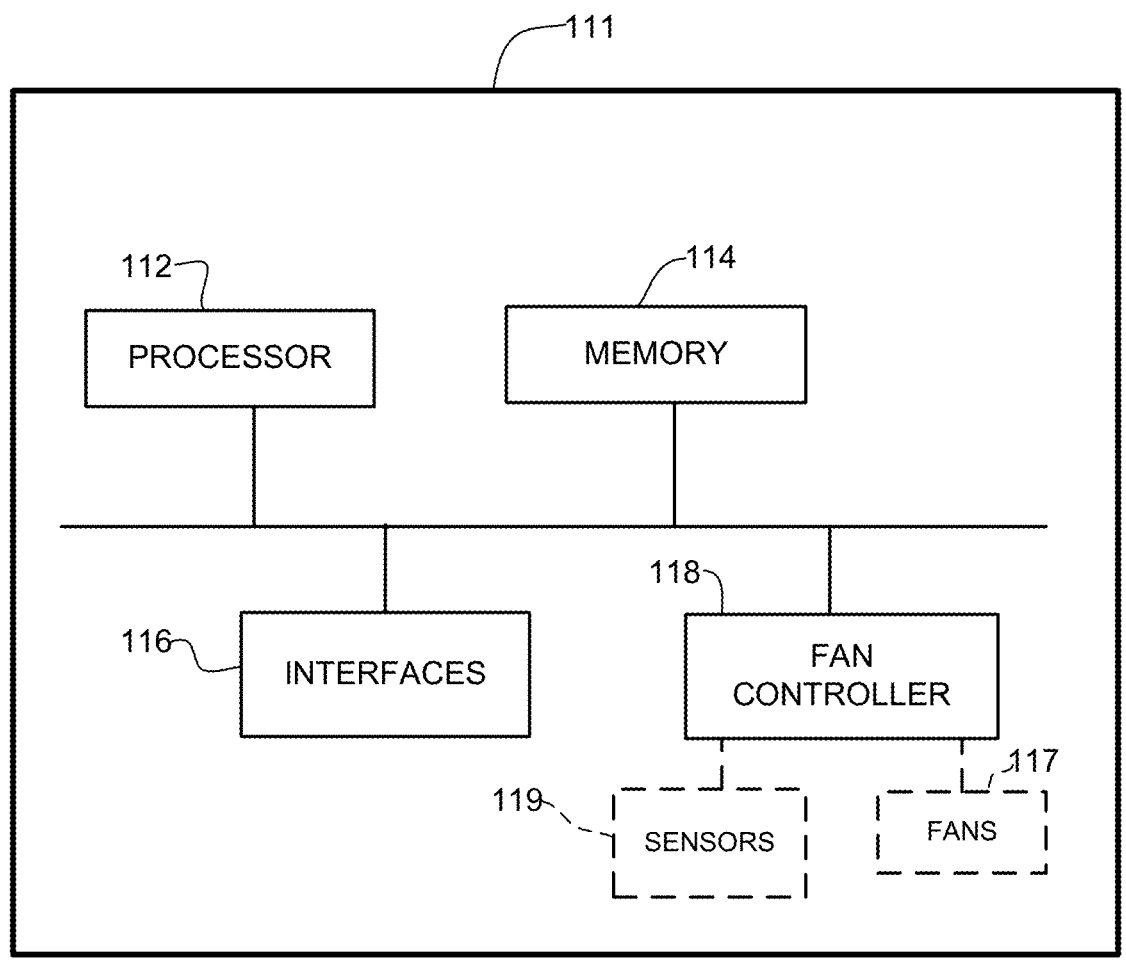
FIG. 11 is a block diagram depicting an example of a network device that may be used to implement the embodiments described herein.

FIG. 11 illustrates an example of a network device 111 (e.g., modular electronic system 10) that may be used to implement the embodiments described herein. In one embodiment, the network device 111 is a programmable machine that may be implemented in hardware, software, or any combination thereof. The network device 111 includes one or more processor 112, memory 114, network interfaces 116, and fan controller 118.

Memory 114 may be a volatile memory or non-volatile storage, which stores various applications, operating systems, modules, and data for execution and use by the processor 112. For example, components of the fan controller 118 (e.g., code, logic, software, firmware, etc.) may be stored in the memory 114. The network device 111 may include any number of memory components.

Logic may be encoded in one or more tangible media for execution by the processor 112. For example, the processor 112 may execute codes stored in a computer-readable medium such as memory 114. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. The processor 112 may be operable to perform one or more steps shown in the flowcharts of FIG. 5, 9 or 10, for example. The network device 111 may include any number of processors 112.

The fan controller 118 may comprise one or more components (software, firmware, code, logic, programmable logic) operable to detect insertion of a fan, receive input from sensors 119 (e.g., sensor or element used to provide information or status of the fan tray, RPM of fan, or temperature) and based on this input, modify speed of fans 117. The fan controller 118 may comprise a central controller operable to control one or more fans, one or more microcontrollers located at each fan, or any combination thereof. As previously described, microcontrollers at each fan may communicate with each other over Bluetooth communications, for example.

The network interfaces 116 may comprise any number of interfaces (connectors, line cards, ports) for receiving data or transmitting data to other devices. The network interface 116 may include, for example, an Ethernet interface located on one of the line cards for connection to a computer or network.

It is to be understood that the network device 111 shown in FIG. 11 and described above is only an example and that different configurations of network devices may be used. For example, the network device 111 may further include any suitable combination of hardware, software, algorithms, processors, devices, components, or elements operable to facilitate the capabilities described herein.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. A method comprising:
    detecting reverse rotation of an inserted fan that is inserted into a modular electronic system comprising at least one other fan, wherein said reverse rotation of the inserted fan is caused by a back pressure generated by said at least one other fan rotating in a forward direction;
    applying current pulses to stop said reverse rotation of the inserted fan and start rotation of the inserted fan in said forward direction; and
    operating the inserted fan and said at least one other fan with rotation in said forward direction;
    wherein applying said current pulses comprises applying a specified number of the current pulses and checking a rotation direction of the inserted fan.

2. The method of claim 1, wherein applying said current pulses further comprises applying the current pulses with a lower duty cycle if said rotation of the inserted fan continues and repeating applying said specified number of the current pulses.

3. The method of claim 1, wherein operating the inserted fan and said at least one other fan with the rotation in said forward direction comprises utilizing linear current control.

4. The method of claim 1, further comprising identifying a speed of approximately zero at the inserted fan and applying low duty cycle current pulses to start the inserted fan.

5. The method of claim 1, further comprising detecting removal of another fan at the modular electronic system and increasing a speed of said at least one other fan until said rotation of the inserted fan in said forward direction is detected.

6. The method of claim 1, wherein said at least one other fan comprises at least two fans operable to cool line cards in the modular electronic system.

7. A modular electronic system comprising:
    an electronic module;
    at least two removable fans for cooling the electronic module; and
    a fan controller for controlling a speed of the at least two removable fans and receiving input comprising the speed and a direction of rotation of the at least two removable fans,
    wherein the fan controller is operable upon detecting reverse rotation of one of the at least two removable fans to initiate application of current pulses to said one of the at least two removable fans to stop said reverse rotation of said one of the at least two removable fans; and
    wherein the fan controller is configured to initiate application of a specified number of the current pulses to said one of the at least two removable fans if said reverse rotation of said one of the at least two removable fans continues.

8. The modular electronic system of claim 7, wherein the fan controller comprises programmable logic.

9. The modular electronic system of claim 7, wherein the application of said current pulses comprises application of high duty cycle current pulses, and wherein low duty cycle current pulses are applied to start said one of the at least two removable fans if the speed is approximately zero or cool fan components between applications of said high duty cycle current pulses.

10. The modular electronic system of claim 7, wherein the fan controller is configured to detect removal of another of the at least two removable fans at the modular electronic system and increase a speed of remaining fans of the at least two removable fans.

11. A modular electronic system comprising:
    an electronic module;
    at least two removable fans for cooling the electronic module; and
    a fan controller for controlling a speed of the at least two removable fans and receiving input comprising the speed and a direction of rotation of the at least two removable fans,
    wherein the fan controller is operable upon detecting reverse rotation of one of the at least two removable fans to initiate application of current pulses to said one of the at least two removable fans to stop said reverse rotation of said one of the at least two removable fans; and wherein the fan controller is configured to initiate application of lower duty cycle current pulses to said one of the at least two removable fans if said reverse rotation of said one of the at least two removable fans continues to allow electronics to cool down before application of additional current pulses.

12. The modular electronic system of claim 11, wherein the fan controller comprises programmable logic.

13. A method comprising:

controlling a fan speed and receiving input comprising the fan speed and a direction of rotation of fans in a modular electronic system;

detecting reverse rotation of an inserted fan of the fans, wherein the inserted fan is inserted into the modular electronic system;

applying a specified number of high duty cycle current pulses to stop said reverse rotation of the inserted fan; and applying a specified number of low duty cycle current pulses if said reverse rotation of the inserted fan continues to allow electronics to cool down before application of additional high duty cycle current pulses.

14. The method of claim 13, wherein the fans comprise at least two fans operable to cool line cards in the modular electronic system.

15. The method of claim 13, further comprising detecting removal of another fan at the modular electronic system and increasing a speed of at least one other of the fans until a forward rotation is detected at the inserted fan.

16. The method of claim 13, further comprising operating all of the fans with rotation in a forward direction utilizing linear current control.

17. The method of claim 13, further comprising identifying a speed of approximately zero at the inserted fan and applying the low duty cycle current pulses to start the inserted fan.

\* \* \* \* \*

UNITED STATES PATENT AND TRADEMARK OFFICE
CERTIFICATE OF CORRECTION

PATENT NO. : 11,212,937 B2
APPLICATION NO. : 16/360956
DATED : December 28, 2021
INVENTOR(S) : Paolo Sironi et al.

It is certified that error appears in the above-identified patent and that said Letters Patent is hereby corrected as shown below:

In the Claims

Claim 2, Column 10, Line 6, please replace "if said rotation of" with --if said reverse rotation of--

Signed and Sealed this
Eighth Day of November, 2022

Katherine Kelly Vidal
*Director of the United States Patent and Trademark Office*